United States Patent
Parker

(10) Patent No.: US 7,960,717 B2
(45) Date of Patent: Jun. 14, 2011

(54) ELECTRONIC DEVICE AND PROCESS FOR FORMING SAME

(75) Inventor: Ian D. Parker, Santa Barbara, CA (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 701 days.

(21) Appl. No.: 11/644,440

(22) Filed: Dec. 22, 2006

(65) Prior Publication Data

US 2007/0181648 A1    Aug. 9, 2007

Related U.S. Application Data

(60) Provisional application No. 60/754,977, filed on Dec. 29, 2005.

(51) Int. Cl.
*H01L 51/00* (2006.01)

(52) U.S. Cl. ... 257/40; 257/642; 257/643; 257/E51.022; 438/82; 438/99

(58) Field of Classification Search ............ 257/40, 257/99, 642, 643, 759, E21.299, E51.018–E51.022; 438/29, 69, 82, 99; 313/504
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 6,459,199 B1 | 10/2002 | Kido et al. | |
| 6,992,326 B1* | 1/2006 | MacPherson et al. | 257/40 |
| 7,582,894 B2* | 9/2009 | Suh et al. | 257/40 |
| 2001/0019782 A1 | 9/2001 | Igarashi et al. | |
| 2002/0121638 A1 | 9/2002 | Grushin et al. | |

FOREIGN PATENT DOCUMENTS

| | | |
|---|---|---|
| EP | 1191612 A2 | 3/2002 |
| EP | 1191614 A2 | 3/2002 |
| WO | WO 02/02714 A2 | 1/2002 |
| WO | WO 02/15645 A1 | 2/2002 |
| WO | WO 02/31896 A2 | 4/2002 |

OTHER PUBLICATIONS

U.S. Appl. No. 11/027,133, filed Dec. 30, 2004, Charles Douglas MacPherson et al.
U.S. Appl. No. 10/910,496, filed Aug. 3, 2004, Charles Douglas MacPherson et al.
CRC Handbook of Chemistry and Physics, 81$^{st}$ Edition, 2000 (Book Not Supplied).

* cited by examiner

*Primary Examiner* — Matthew C Landau
*Assistant Examiner* — Jessica Hall

(57) ABSTRACT

An electronic device includes a substrate, a first organic electronic component overlying the substrate, wherein, from a plan view, the first organic electronic component defines a perimeter of a first pixel area, and at least one post structure, wherein the at least one post structure lies within the perimeter of the first pixel area. The electronic device can also include a confinement structure overlying the substrate and having a first opening, wherein from a plan view, the first opening has a perimeter that substantially corresponds to a perimeter of the first organic electronic component.

18 Claims, 6 Drawing Sheets

ELECTRONIC DEVICE AND PROCESS FOR FORMING SAME

CROSS REFERENCE TO RELATED APPLICATIONS

This application claims the benefit of priority under 35 U.S.C. §119(e) from provisional U.S. Application No. 60/754,977, "Electronic Device and Process for Forming Same", Parker, filed Dec. 29, 2005, which is incorporated herein by reference in its entirety.

BACKGROUND INFORMATION

1. Field of the Disclosure

This invention relates in general to electronic devices and methods for forming electronic devices. More specifically, the invention relates to electronic devices including organic electronic components.

2. Background of the Related Art

Electronic devices, including organic electronic devices, continue to be more extensively used in everyday life. Examples of organic electronic device include Organic Light-Emitting Diode ("OLED") displays. Manufacture of such devices can require control over the spreading of deposited liquid compositions. Typically, this has been accomplished by the use of an organic or inorganic material deposited over a panel to form a confinement structure, such as a well structure or channel, to help prevent the flow of the liquid composition into undesirable areas. The confinement structure could be fluorinated to improve the confinement through an increased contact angle and reduced surface energy.

The confinement structures, such as well structures or channels, generally reduce the useful surface area for deposition of organic layers of an organic electronic component. In addition, useful surface area is further reduced by thickness variations near walls of the confinement structure. Such thickness variations reduce the effective emitting area in organic electronic devices, such as display devices, and can lead to luminance non-uniformity, color variation, and non-uniform degradation of electrical properties in a display device.

The foregoing general description and the following detailed description are exemplary and explanatory only and are not restrictive of the invention, as defined in the appended claims.

SUMMARY

In a first aspect, an electronic device includes a substrate, a first organic electronic component overlying the substrate, wherein, from a plan view, the first organic electronic component defines a perimeter of a first pixel area, and at least one post structure, wherein the at least one post structure lies within the perimeter of the first pixel area.

In a second aspect, an electronic device includes a substrate, a first organic electronic component overlying the substrate, and a confinement structure overlying the substrate and having a first opening, wherein from a plan view, the first opening has a perimeter that substantially corresponds to a perimeter of the first organic electronic component. The electronic device also includes at least one post structure, wherein from a plan view, the at least one post structure lies within the perimeter of the first opening.

In a third aspect, an electronic device includes a substrate, an array of organic electronic components overlying the substrate, wherein the array comprises rows and columns of organic electronic components, and a confinement structure overlying the substrate and having an array of openings, wherein from a plan view, the array of openings substantially corresponds to the array of organic electronic components. The electronic device also includes post structures, wherein from a plan view, the post structures lie within the array of openings and does not contact the confinement structure.

BRIEF DESCRIPTION OF THE DRAWINGS

The invention is illustrated by way of example and not limitation in the accompanying figures.

Figure 1:
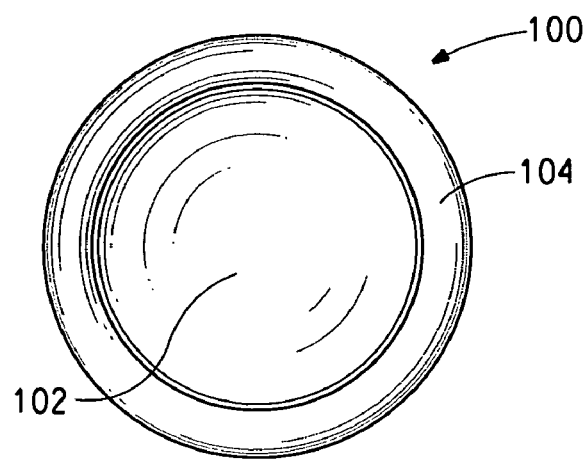
FIGS. 1 and 2 include a plan view illustration and a cross-sectional view illustration, respectively, of an organic layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In a first aspect, an electronic device includes a substrate, a first organic electronic component overlying the substrate, wherein, from a plan view, the first organic electronic component defines a perimeter of a first pixel area, and at least one post structure, wherein the at least one post structure lies within the perimeter of the first pixel area.

In one embodiment of the first aspect, the first organic electronic component includes an organic active layer. In another embodiment, the at least one post structure comprises an island, a mesa, or a combination thereof.

In a further embodiment of the first aspect, a first electrode lies between the substrate and the at least one post structure. In another embodiment, from a cross-sectional view, the at least one post structure has a positive slope. In yet another embodiment, a second electrode overlies at least portions of the at least one post structure. In still another embodiment, a surface of the at least one post structure is hydrophilic.

In a second aspect, an electronic device includes a substrate, a first organic electronic component overlying the substrate, and a confinement structure overlying the substrate and having a first opening, wherein from a plan view, the first opening has a perimeter that substantially corresponds to a perimeter of the first organic electronic component. The electronic device also includes at least one post structure, wherein from a plan view, the at least one post structure lies within the perimeter of the first opening.

In one embodiment of the second aspect, the first organic electronic component includes an organic active layer. In another embodiment, a surface of the confinement structure is hydrophobic. In yet another embodiment, the at least one post structure comprises an island, a mesa, or a combination thereof.

In a further embodiment of the second aspect, a first electrode lies between the substrate and the at least one post structure, between the substrate and the confinement structure, or a combination thereof. In another embodiment, from a cross-sectional view, the at least one post structure has a positive slope. In yet another embodiment, a second electrode overlies at least portions of the confinement structure and the at least one post structure. In still another embodiment, a surface of the at least one post structure is hydrophilic.

In a third aspect, an electronic device includes a substrate, an array of organic electronic components overlying the substrate, wherein the array comprises rows and columns of organic electronic components, and a confinement structure overlying the substrate and having an array of openings, wherein from a plan view, the array of openings substantially corresponds to the array of organic electronic components. The electronic device also includes post structures, wherein from a plan view, the post structures lie within the array of openings and does not contact the confinement structure.

In one embodiment of the third aspect, the array of organic electronic components comprise an organic active layer. In another embodiment, a surface of the confinement structure is hydrophobic. In yet another embodiment, the post structures comprise islands, mesas, or combinations thereof.

In a further embodiment of the third aspect, a first electrode lies between the substrate and the post structures, between the substrate and the confinement structure, or a combination thereof. In another embodiment, from a cross-sectional view, the post structures have a positive slope. In yet another embodiment, a second electrode overlies at least portions of the confinement structure and the post structures. In still another embodiment, a surface of the post structures is hydrophilic.

Many aspects and embodiments have been described above and are merely exemplary and not limiting. After reading this specification, skilled artisans appreciate that other aspects and embodiments are possible without departing from the scope of the invention.

Other features and advantages of the invention will be apparent from the following detailed description, and from the claims. The detailed description first addresses Definitions followed by Layer Formation and Layer Thickness, Structures, Layers and Components of an Electronic Device, Process for Forming Electronic Devices, Alternative Embodiments, and Advantages.

1. DEFINITIONS AND CLARIFICATION OF TERMS

Before addressing details of embodiments described below, some terms are defined or clarified. As used herein, the term "active" when referring to a layer or material is intended to mean a layer or material that has electronic or electro-radiative properties. An active layer material may emit radiation or exhibit a change in concentration of electron-hole pairs when receiving radiation.

The term "active matrix" is intended to mean an array of electronic components and corresponding driver circuits within the array.

The term "channel" when referring to an opening is intended to mean such opening has a length that is significantly greater than its width.

The term "circuit" is intended to mean a collection of electronic components that collectively, when properly connected and supplied with the proper potential(s), performs a function. A circuit may include an active matrix pixel within an array of a display, a column or row decoder, a column or row array strobe, a sense amplifier, a signal or data driver, or the like.

The term "confinement structure" is intended to mean a structure overlying a substrate, wherein the structure serves a principal function of at least partially confining a solid or liquid composition to a portion of the substrate.

The term "connected," with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "coupled" is intended to mean a connection, linking, or association of two or more electronic components, circuits, systems, or any combination of at least two of: (1) at least one electronic component, (2) at least one circuit, or (3) at least one system in such a way that a signal (e.g., current, voltage, or optical signal) may be transferred from one to another. Non-limiting examples of "coupled" can include direct connections between electronic components, circuits or electronic components with switch(es) (e.g., transistor(s)) connected between them, or the like.

The term "driver circuit" is intended to mean a circuit configured to control the activation of an electronic component, such as an organic electronic component.

The term "electrically continuous" is intended to mean a layer, member, or structure that forms an electrical conduction path without an electrical open circuit.

The term "electrode" is intended to mean a structure configured to transport carriers. For example, an electrode may be an anode, a cathode. Electrodes may include parts of transistors, capacitors, resistors, inductors, diodes, organic electronic components and power supplies.

The term "electronic component" is intended to mean a lowest level unit of a circuit that performs an electrical function. An electronic component may include a transistor, a diode, a resistor, a capacitor, an inductor, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the proper potential(s), performs a function. An electronic device may include, or be part of, a system. Examples of electronic devices include displays, sensor arrays, computer systems, avionics, automobiles, cellular phones, and many other consumer and industrial electronic products.

The term "hydrophilic" is intended to mean that an edge of a liquid exhibits a wetting angle less than 90 degrees with respect to a surface that it contacts.

The term "hydrophobic" is intended to mean that an edge of a liquid exhibits a wetting angle of 90 degrees or more with respect to a surface that it contacts.

The term "islands" is intended to mean members of a patterned layer, wherein the patterning extends through the entire thickness of the layer, and the members are space-apart from each other.

The term "layer" is used interchangeably with the term "film" and refers to a coating covering a desired area. The area can be as large as an entire device or as small as a specific functional area such as the actual visual display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

The term "liquid composition" is intended to mean an organic active material that is dissolved in a liquid medium or media to form a solution, dispersed in a liquid medium or media to form a dispersion, or suspended in a liquid medium or media to form a suspension or an emulsion.

The term "mesas" is intended to mean features of a patterned layer, wherein the patterning extends only partially, but not completely, through the thickness of the layer, and the features are space-apart from each other.

The term "negative slope" is intended to mean a characteristic of a structure, wherein a side of the structure forms an acute angle with respect to a substantially planar surface over which the structure is formed.

The term "opening" is intended to mean an area characterized by the absence of a particular structure that surrounds the area, as viewed from the perspective of a plan view.

The term "organic electronic device" is intended to mean a device including one or more semiconductor layers or materials. Organic electronic devices include: (1) devices that convert electrical energy into radiation (e.g., an light-emitting diode, light emitting diode display, or diode laser), (2) devices that detect signals through electronics processes (e.g., photodetectors (e.g., photoconductive cells, photoresistors, photoswitches, phototransistors, or phototubes), IR detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "overlying," when used to refer to layers, members or structures within a device, does not necessarily mean that one layer, member or structure is immediately next to or in contact with another layer, member, or structure.

The term "passive matrix" is intended to mean an array of electronic components, wherein the array does not have any driver circuits.

The term "perimeter" is intended to mean a boundary of a layer, member, or structure that, from a plan view, forms a closed planar shape.

The term "positive slope" is intended to mean a characteristic of a structure, wherein a side of the structure forms an obtuse angle with respect to a substantially planar surface over which the structure is formed.

The term "post structure" is intended to mean a structure overlying a substrate, wherein the structure serves a principal function of modifying the thickness variation of a layer that, from a plan view, surrounds the post structure.

The term "structure" is intended to mean one or more patterned layers or members, which by itself or in combination with other patterned layer(s) or member(s), forms a unit that serves an intended purpose. Examples of structures include electrodes, well structures, channels, post structures, and the like.

The term "substrate" is intended to mean a base material that can be either rigid or flexible and may be include one or more layers of one or more materials, which can include, but are not limited to, glass, polymer, metal or ceramic materials or combinations thereof.

The term "well structure" is intended to mean a structure overlying a substrate, wherein the structure serves a principal function of at least partially separating an object, a region, or any combination thereof within or overlying the substrate from another object or region.

The term "wetting angle" is intended to mean a tangent angle at the edge interface between a gas, a liquid and a solid surface as measured from the solid surface through the liquid to a gas/liquid interface.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise. Group numbers corresponding to columns within the periodic table of the elements use the "New Notation" convention as seen in the *CRC Handbook of Chemistry and Physics*, $81^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. LAYER FORMATION AND LAYER THICKNESS

An organic layer can be formed by dispensing a liquid composition over a substrate or a workpiece. After dispensing the liquid composition, liquid medium or liquid media within the liquid composition evaporate, increasing the viscosity of the liquid composition and forming an organic layer. Surface tension, wetting angle, surface energy and viscosity within the liquid composition lead to variances in thickness of the organic layer across the organic layer.

Figure 2:
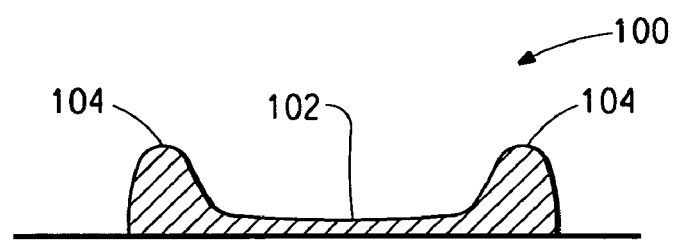

FIGS. 1 and 2 include a plan view illustration and a cross-sectional view illustration, respectively, of an exemplary organic layer. The exemplary organic layer 100 has significantly different thickness at locations within a center portion 102 than at locations within an edge portion 104. As illustrated in FIG. 2, the organic layer 100 at locations near the edge portion 104 is thicker than the organic layer 100 at locations within the center portion 102.

In one exemplary embodiment, the organic layer 100 at locations within the center portion 102 has a relatively uniform thickness. The thickness of the organic layer increases rapidly to a maximum when moving along the surface of the organic layer toward the edge portion 104 and drops from the maximum to an underlying interface when moving toward the outermost edge of the organic layer 100. Alternatively, the organic layer 100 has a relatively uniform center portion and a non-uniform edge portion, such as a thicker edge portion or thinner edge portion.

When such an organic layer is incorporated into electronic components, the thickness of the layer can affect performance characteristics of the electronic component. Thicker regions within an organic layer can reduce charge flow through the organic layer. For thinner regions within an organic active layer of radiation-emitting component, electrons and hole may recombine outside of the organic active layer, thereby reducing the radiation emitted from the organic active layer. For thinner regions within an organic active layer of radiation-responsive component, insufficient amounts of electrons and hole may be generated from the organic active layer.

In one particular embodiment, the organic layer 100 is an organic active layer. The thickness of the center portion 102 of the organic active layer is approximately 30 to 100 nm. The thickness of the edge portion 104 of the organic active layer may be as high as approximately 5000 nm. In one embodiment, the thickness of the edge portion 104 is not greater than 4000 nm. In another embodiment, the thickness is not greater than 3000 nm, and in still another embodiment, the thickness is not greater than 2000 nm. For example, the thickness of the edge portion 104 may be approximately 100 to 5000 nm, such as approximately 100 to 4000 nm, approximately 100 to 3000 nm, or approximately 100 to 2000 nm. In one exemplary embodiment, the ratio of thickness of the edge portion to the thickness of the center portion is 3:1 to 10:1. In another exemplary embodiment, the ratio of thickness of the edge portion to the thickness of the center portion is 1:3 to 1:10. Alternatively the organic layer 100 is selected from a group consisting of an organic active layer, a charge-transport layer, a charge blocking layer, a charge injection layer or any combination thereof.

Figure 3:
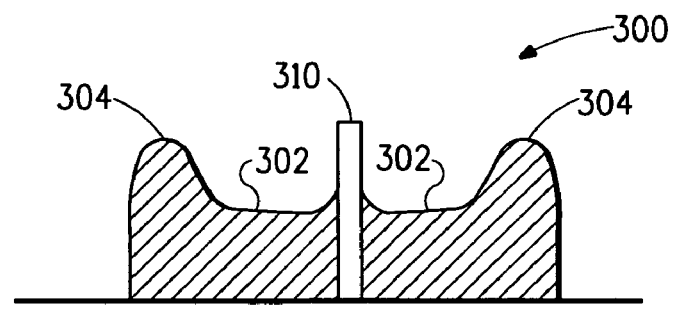
FIG. 3 includes an illustration of a cross-sectional view of a portion of an exemplary embodiment of a post structure after a liquid composition is deposited to form an organic layer.

FIG. 3 is a cross-sectional view of an illustration of one embodiment, wherein a post structure 310 is used to provide a more uniform thickness across an organic layer 300 in an electronic component. Center portions 302 between the edge of the organic layer 300 and the post structure 310 may have a thickness of approximately 75 to 4000 nm, such as approximately 75 to 3000 nm, approximately 75 to 2000 nm, or approximately 75 to 1000 nm. Edge portions 304 of the organic layer 300 may have thicknesses of approximately 100 to 5000 nm, such as approximately 100 to 4000 nm, approximately 100 to 3000 nm, or approximately 100 to 2000 nm. In one exemplary embodiment, the ratio of thickness of the edge portion to the thickness of the center portion is 1.2:1 to 2.5:1. In another exemplary embodiment, the ratio of thickness of the edge portion to the thickness of the center portion is 1:1.2 to 1:2.5.

Liquid compositions, continuous printing apparatuses, and methods of using liquid compositions and continuous printing apparatuses are described in more detail in U.S. patent application Ser. No. 11/027,133, entitled "Electronic Devices and Processes For Forming the Same" by MacPherson et al., filed on Dec. 30, 2004. In addition to continuous printing apparatuses, other apparatuses, such as ink jet printers, spin coaters, etc. can be used to deposit or otherwise form liquid compositions over substrates.

The liquid composition can be in the form of a solution, dispersion, emulsion, or suspension. In the paragraphs that follow, non-limiting examples of solid materials and liquid medium are given. The solid material(s) can be selected based upon the electronic or electro-radiative properties for a subsequently formed layer. The liquid medium can be selected based on criteria described later in this specification.

An organic layer printed using a printing apparatus (e.g., an ink-jet printing apparatus, a continuous printing apparatus, another suitable selective liquid depositing apparatus, or any combination thereof can include an organic active layer, (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, a suitable radiation-emitting material includes one or more small molecule materials, one or more polymeric materials, or a combination thereof. Small molecule materials may include those described in, for example, U.S. Pat. No. 4,356,429 ("Tang"); U.S. Pat. No. 4,539,507 ("Van Slyke"); U.S. Patent Application Publication No. US 2002/0121638 ("Grushin"); and U.S. Pat. No. 6,459,199 ("Kido"). Alternatively, polymeric materials may include those described in U.S. Pat. No. 5,247,190 ("Friend"); U.S. Pat. No. 5,408,109 ("Heeger"); and U.S. Pat. No. 5,317,169 ("Nakano"). An exemplary material is a semi-conducting conjugated polymer. An example of such polymers includes poly(paraphenylenevinylene) (PPV), a PPV copolymer, a polyfluorene, a polyphenylene, a polyacetylene, a polyalkylthiophene, poly(n-vinylcarbazole) (PVK), or the like. In one specific embodiment, a radiation-emitting active layer without any guest material may emit blue light.

For a radiation-responsive organic active layer, a suitable radiation-responsive material may include many a conjugated polymer or an electroluminescent material. Such a material includes for example, a conjugated polymer or electro- and photo-luminescent material. A specific example includes poly(2-methoxy,5-(2-ethyl-hexyloxy)-1,4-phenylene vinylene) ("MEH-PPV") or a MEH-PPV composite with CN-PPV.

Alternatively, an organic layer may be formed, such as a charge transport layer, a charge injection layer, a charge blocking layer or any combination thereof. For example, the organic layer may be a hole-injection layer, a hole-transport layer, an electron-blocking layer, an electron-injection layer, an electron-transport layer, a hole-blocking layer, or any combination thereof.

For a hole-injection layer, hole transport layer, electron-blocking layer, or any combination thereof, a suitable material includes polyaniline ("PANI"), poly(3,4-ethylenedioxythiophene) ("PEDOT"), an organic charge transfer compound, such as tetrathiafulvalene tetracyanoquinodimethane (TTF-TCQN), a hole transport material as described in Kido, or any combination thereof.

For an electron-injection layer, electron-transport layer, hole-blocking layer, or any combination thereof, a suitable material includes a metal-chelated oxinoid compound (e.g., $Alq_3$); phenanthroline-based compounds (e.g., 2,9-dimethyl-4,7-diphenyl-1,10-phenanthroline ("DDPA"), 4,7-diphenyl-1,10-phenanthroline ("DPA")); an azole compound (e.g., 2-(4-biphenyl)-5-(4-t-butylphenyl)-1,3,4-oxadiazole ("PBD"), 3-(4-biphenyl)-4-phenyl-5-(4-t-butylphenyl)-1,2,4-triazole ("TAZ"); an electron-transport material as described in Kido; or any combination thereof.

For an electronic component, such as a resistor, transistor, capacitor, etc., the organic layer may include one or more of thiophenes (e.g., polythiophene, poly(alkylthiophene), alkylthiophene, bis(dithienthiophene), alkylanthradithiophene, etc.), polyacetylene, pentacene, phthalocyanine, or any combination thereof.

An example of an organic dye includes 4-dicyanmethylene-2-methyl-6-(p-dimethyaminostyryl)-4H-pyran (DCM), coumarin, pyrene, perylene, rubrene, derivatives thereof, or any combination thereof.

An example of an organometallic material includes a functionalized polymer comprising a functional group coordinated to at least one metal. An exemplary functional group contemplated for use includes a carboxylic acid, carboxylic acid salt, sulfonic acid group, sulfonic acid salt, a group having an OH moiety, an amine, a imine, diimine, a N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as a tris(8-hydroxyquinolato)aluminum ($Alq_3$); a cyclometalated iridium, and a platinum electroluminescent compound, such as a complex of an iridium with a phenylpyridine, a phenylquinoline, or a phenylpyrimidine ligand, as disclosed in published PCT Application WO 02/02714, or any an organometallic complex described in, for example, published applications US 2001/0019782, EP 1191612, WO 02/15645, WO 02/31896, and EP 1191614; or any mixture thereof.

An example of a conjugated polymer includes poly(phenylenevinylene), polyfluorene, poly(spirobifluorene), copolymer thereof, or any mixture thereof.

Selecting a liquid medium or media can also be a factor for achieving the proper characteristics of the liquid composition. A factor to be considered when choosing a liquid medium (media) includes, for example, viscosity of the resulting solution, emulsion, suspension, or dispersion, molecular weight of a polymeric material, solids loading, type of liquid medium, vapor pressure of the liquid medium, temperature of an underlying substrate, thickness of an organic layer that receives a guest material, or any combination thereof The liquid composition can include at least one organic solvent. An exemplary organic solvent includes a halogenated solvent, a hydrocarbon solvent, an aromatic hydrocarbon solvent, an ether solvent, a cyclic ether solvent, an alcohol solvent, a ketone solvent, an acetate solvent, a nitrile solvent, a sulfoxide solvent, an amide solvent, or any combination thereof.

An exemplary halogenated solvent includes carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, or any combination thereof.

An exemplary hydrocarbon solvent includes pentane, hexane, cyclohexane, heptane, octane, decahydronaphthalene, petroleum ether, ligroine, or any combination thereof.

An exemplary aromatic hydrocarbon solvent includes benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent suitable includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

An alcohol ether solvent may also be employed. An exemplary alcohol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, ethylene glycol monomethyl ether, propylene glycol monomethyl ether, or any combination thereof.

An exemplary ketone solvent includes acetone, methylethyl ketone, methyl iso-butyl ketone, cyclopentanone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary acetate solvent includes ethylene glycol monomethyl ether acetate, propylene glycol monomethyl ether acetate, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent suitable includes dimethyl sulfoxide, di-n-butyl sulfoxide, tetramethylene sulfoxide, methyl phenyl sulfoxide, or any combination thereof.

An exemplary amide solvent suitable includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combination thereof.

A crown ether contemplated includes all crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combination thereof.

In another embodiment, the liquid medium includes water. A conductive polymer complexed with a water-insoluble colloid-forming polymeric acid can be deposited over a substrate and used as a charge transport layer.

Many different classes of liquid media (e.g., halogenated solvents, hydrocarbon solvents, aromatic hydrocarbon solvents, water, etc.) are described above. A mixture of more than one of the liquid media from different classes may also be used.

3. STRUCTURES, LAYERS, AND COMPONENTS OF AN ELECTRONIC DEVICE

An electronic device can include an array of organic electronic components and a confinement structure having openings. Confinement structure are described in more detail in U.S. patent application Ser. No. 10/910,496, entitled "Electronic Device and Process For Forming the Same" by MacPherson et al., filed on Aug. 3, 2004. Each organic electronic component may include first and second electrodes (e.g. an anode and a cathode) separated by one or more layers including an organic active layer.

The array of organic electronic components may be part of a passive matrix, or the array of organic electronic components may be part of an active matrix. As such, an electronic device may include active matrix and passive matrix displays.

Generally, each organic electronic component includes two electrodes separated by one or more organic active layers. In addition, other layers, such as hole-transport layers and electron-transport layers, may be included between the two electrodes. Confinement structures having openings that correspond to the perimeter of each of the organic electronic components define wells within which, portions of the organic electronic components are formed. As such, these structures may periodically be described as well structures herein.

In one embodiment, from a plan view, each opening within the well structure has a perimeter that substantially corresponds to a perimeter of an organic electronic component. In one example, both the well structure and a post structure may have a thickness between approximately 3 and 10 micrometers. In one particular embodiment, the thicknesses of the well structure and the post structure are the same. In another particular embodiment, the thicknesses of the well structure and the post structure are different.

In another embodiment, an electronic device includes a substrate, a confinement structure (e.g. a well structure), a post structure, and a first electrode. The confinement structure has openings and, when viewed from a cross-sectional view, has a negative slope at the openings. The post structure, when viewed from a cross-sectional view, has a positive slope. From a plan view, each of the openings has a perimeter that substantially corresponds to a perimeter of an organic electronic component. The first electrode overlies the confinement structure and post structure and lies within the openings. Portions of the first electrode overlying the structures and lying within the openings are connected to each other. In a particular example, the organic electronic component may include one or more organic active layers. In one embodiment, the first electrode may be a common electrode (e.g., common cathode or common anode for an array of organic electronic components). In another exemplary embodiment, a second electrode may lie between the substrate and the confinement structure. In a further exemplary embodiment, the organic electronic component may be coupled to a driver circuit (not illustrated) lying within the substrate. Note that the second electrode may be formed before the fist electrode in one embodiment.

In one exemplary embodiment, the confinement structure or structures have substantially hydrophobic surfaces. The surfaces exhibit wetting angles with liquid compositions greater than 45°, such as 90° or higher. In contrast, post structures, may have substantially hydrophilic surfaces, exhibiting wetting angles of liquid compositions less than 90°, such as less than 60° or between approximately 0° and about 45°.

4. PROCESS FOR FORMING ELECTRONIC DEVICES

In one embodiment, a process for forming electronic devices includes forming one or more confinement structure and one or more post structure, both of which overlie a substrate. The confinement structure may have a negative slope from a cross-sectional perspective, and the post structure may have a positive slope from a cross-sectional perspective. One exemplary process is illustrated in FIGS. 4 through 13, which can be used for a passive matrix display. Variations on this process may be used to form other electronic devices.

Figure 4:
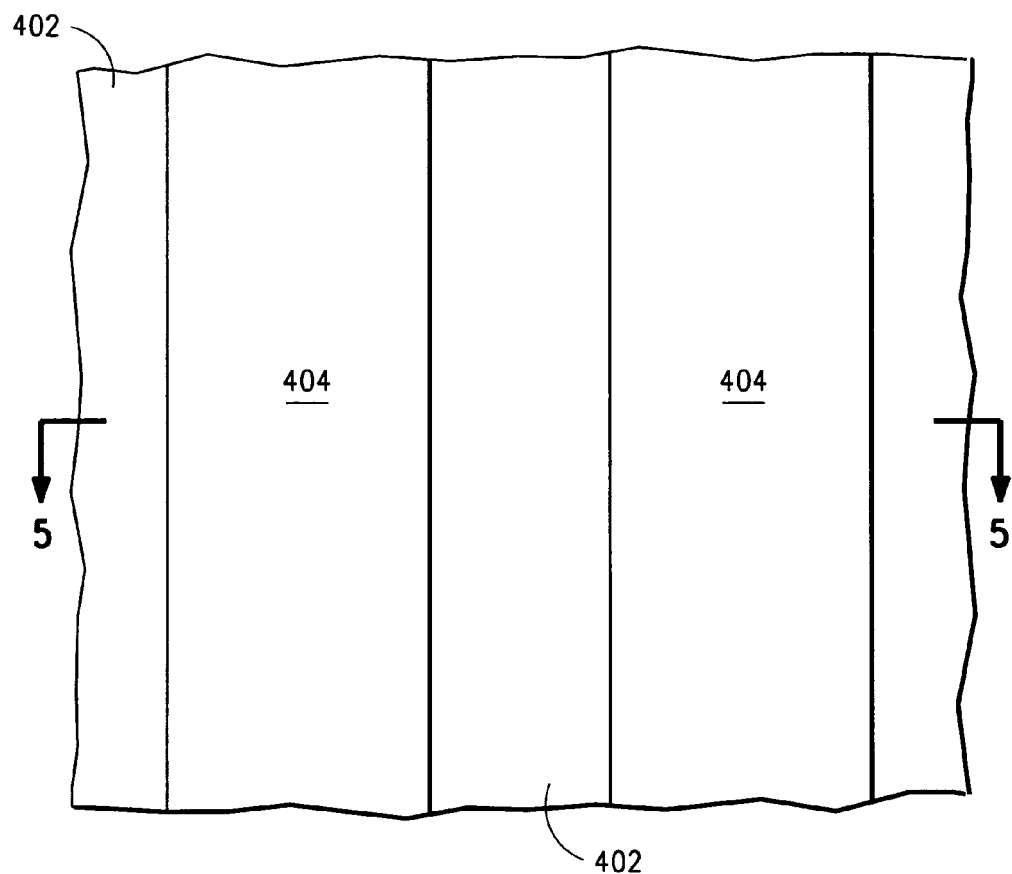
FIGS. 4 and 5 include illustrations of a plan view and a cross-sectional view, respectively, of a portion of a substrate after forming first electrodes over the substrate.
Figure 5:
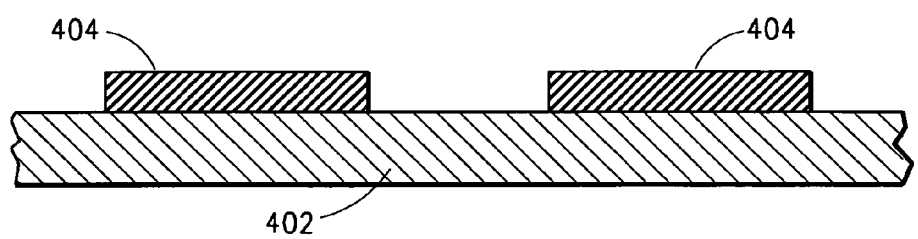

FIG. 4 depicts a plan view of a portion of an exemplary process sequence, and FIG. 5 depicts a cross-sectional view of the portion as viewed from sectioning line 5-5 in FIG. 4. First electrodes 404 are deposited on a substrate 402. The substrate 402 may be a glass or ceramic material or a flexible substrate comprising at least one polymer film. In one exemplary embodiment, the substrate 402 is transparent. Optionally, the substrate 402 may include a barrier layer, such as a uniform barrier layer or a patterned barrier layer.

The first electrodes 404 may be anodes or cathodes. FIG. 4 depicts the first electrodes 404 as parallel strips. Alternately, the first electrodes 404 may be a patterned array of structures having plan view shapes, such as squares, rectangles, circles, triangles, ovals, and the like. Generally, the electrodes may be formed using conventional processes (e.g. deposition, patterning, or a combination thereof).

The first electrodes 404 may include conductive material. In one embodiment, the conductive material may include a transparent conductive material, such as indium-tin-oxide (ITO). Other transparent conductive materials include, for example, indium-zinc-oxide, zinc oxide, and tin oxide. Other exemplary conductive materials include zinc-tin-oxide (ZTO), elemental metals, metal alloys, and combinations thereof. The first electrodes 404 may also be coupled to conductive leads (not illustrated). In one exemplary embodiment, the first electrodes 404 may have hydrophilic surfaces.

Figure 6:
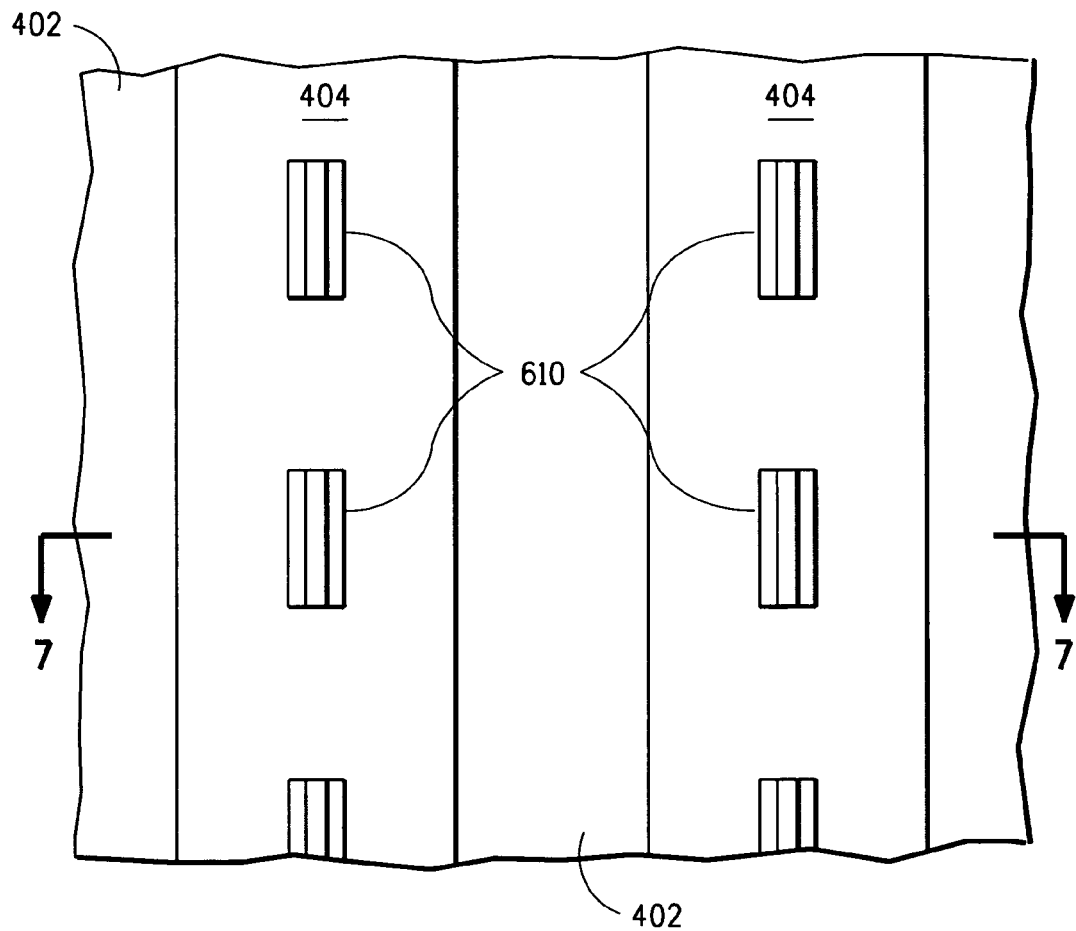
FIGS. 6 and 7 include illustrations of a plan view and a cross-sectional view, respectively, of a portion of a substrate after forming post structures over the first electrodes.
Figure 7:
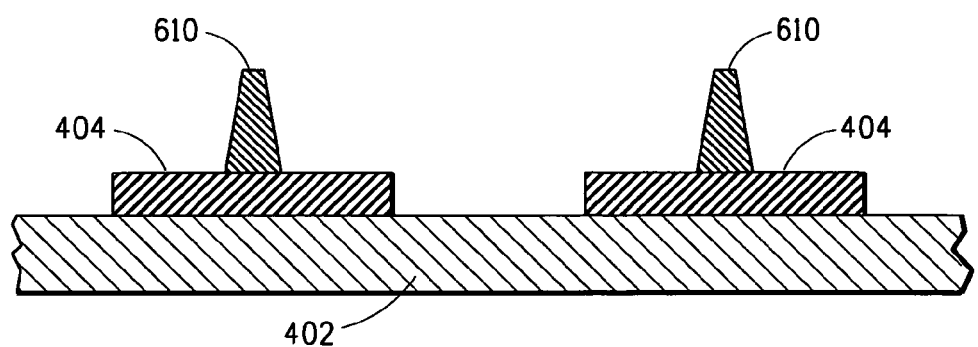

In one embodiment, after formation of first electrodes 404, a subsequent layer may be deposited and patterned to form post structures 610 as illustrated in FIG. 6. FIG. 7 illustrates a cross-sectional view as viewed from sectioning line 7-7 in FIG. 6. Post structures 610 overlie the first electrodes 404 where the openings of a subsequently formed confinement structure will be formed. In one exemplary embodiment, the post structures 610 have a positive slope. Alternatively, the post structures 610 have a vertical or negative slope.

In one exemplary embodiment, the post structures 610 may be formed from one or more resist or polymeric layers. The resist layer can, for example, be a negative resist material or positive resist material. The resist layer can be deposited on the substrate 602 and over the first electrodes 442. Liquid deposition techniques include spin coating, gravure coating, curtain coating, dip coating, slot-die coating, spray coating, continuous nozzle coating, continuous dispense techniques, ink jet printing, gravure printing, screen printing or any combination thereof. The resist may be patterned through selective exposure to radiation, such as ultraviolet (UV) radiation. In one embodiment, the resist layer is spin deposited and baked (not illustrated). The resist layer is exposed to UV radiation through a mask (not illustrated), developed, and baked, leaving post structures 610 having a positive slope. The post structures 610 may further be hard baked, further UV cured, or both. In other embodiments, other methods (e.g., screen printing, gravure printing, etc.) may be used to form the post structures 610.

Alternatively, post structures 610 may be formed of inorganic materials, such as metals, oxides, and nitrides. Such inorganic materials may be deposited and patterned using conventional techniques.

Figure 8:
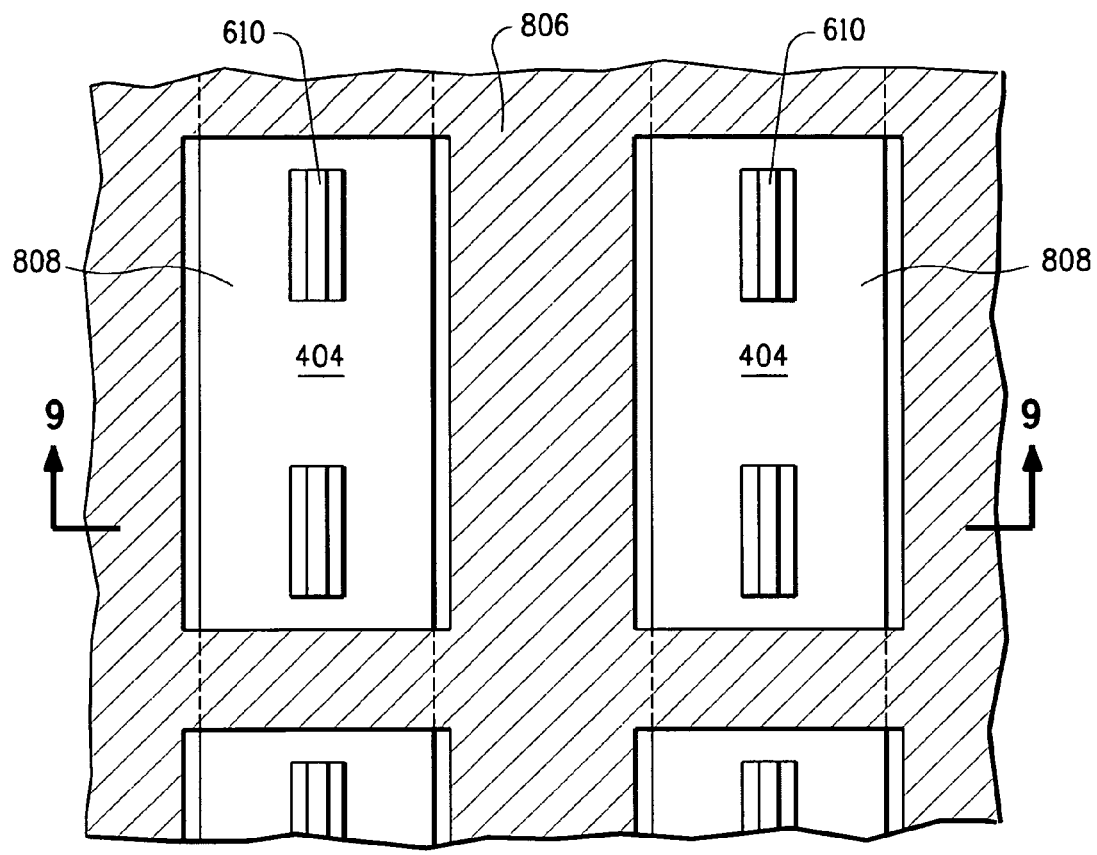
FIGS. 8 and 9 include illustrations of a plan view and a cross-section view, respectively, of a portion of a substrate after forming a confinement structure over the substrate.
Figure 9:
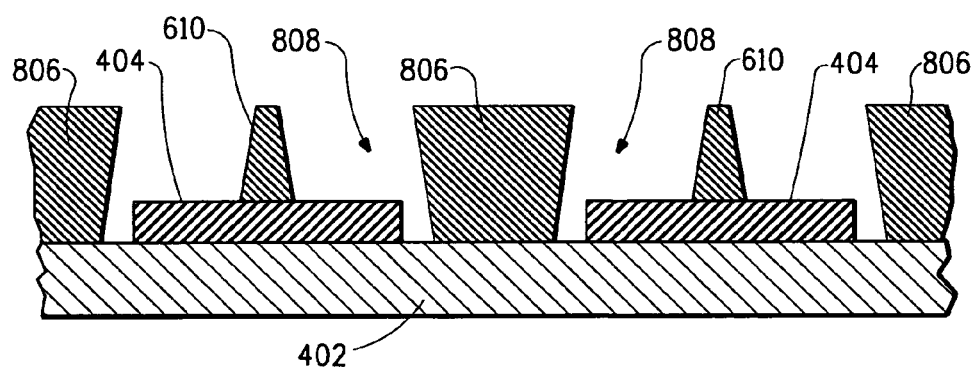

In one embodiment, a subsequent layer may be deposited and patterned into a confinement structure that, from a cross-sectional view, has a negative slope. FIG. 8 depicts a plan view of this sequence in the process, and FIG. 9 illustrates a cross-sectional view of the sequence. A confinement structure 806 is formed that has openings 808 and has a negative slope at the openings 808, as viewed from a cross-sectional view. The openings 808 include the post structures 610 and may expose portions of first electrodes 404. As seen from the plan view, the bottom of the openings 808 may include portions of the first electrodes 404 or may also encompass a portion of the substrate 402.

In one exemplary embodiment, the confinement structure 806 may be formed from resist or polymeric layers. The resist may, for example, be a negative resist material or positive resist material. The resist may be deposited on the substrate 402 and over the first electrodes 404 and the post structures 610. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing. The resist may be patterned through selective exposure to radiation, such as ultraviolet (UV) radiation. In one embodiment, the resist is spin deposited and baked (not illustrate). The resist is exposed to UV radiation through a mask (not illustrated), developed, and baked, leaving a structure having a negative slope at the openings. A sloped can be achieved by (1) using a UV flood exposure (not collimated) when using the masks or (2) overexposing, or underexposing, the resist layer while the mask lies between the resist layer and a radiation source (not illustrated).

In another exemplary embodiment (not illustrated), a sacrificial structure may be used. In one embodiment, a sacrificial layer is deposited and patterned to form a sacrificial structure having a positive slope. In a more specific embodiment, from a cross-sectional view, the sacrificial structure has a complementary profile as compared to the confinement structure 806 that is subsequently formed. The thickness of the sacrificial layer is substantially the same as the subsequently formed confinement structure 806. In one embodiment, a sacrificial layer is deposited over the first electrodes 404, the post structures 610, and the substrate 402. A patterned resist layer is formed over the sacrificial layer using a conventional technique. In one specific embodiment, a conventional resist-erosion etching technique is used to form sloped sidewalls. In another specific embodiment, a conventional isotropic etch is used. The patterned resist layer is then removed using a conventional resist removal process.

Another layer that will be used for the confinement structure 806 is deposited over the sacrificial structure and within openings in the sacrificial structure. In one embodiment, that other layer has a thickness of at least as thick as the thickness of the sacrificial structures. In another embodiment, that other layer is substantially thicker than the sacrificial layer. Portions of the other layer lying outside the sacrificial structure are removed using an etching or polishing technique that is conventional within the inorganic semiconductor arts. After the portions have been removed, the first structure is formed. The sacrificial structure is then removed to form the openings 808 within the confinement structure 806.

In one embodiment, the materials for the confinement structure 806, post structures 610 and sacrificial structures are different to allow the material of the sacrificial structures to be removed selectively compared to the confinement structure 806 and the post structure 610. Exemplary materials include metals, oxides, nitrides, and resists. The material for the sacrificial layer may be selected so that it can be selectively removed from the substrate 402 without causing significant damage to the first electrodes 404. After reading this specification, skilled artisans will be able to choose materials that meet their needs or desires.

In one embodiment, a combination of techniques described above for forming the post structures 610 and confinement structure 806 may be used to produce confinement structure 806 with a negative slope and post structure 610 with a positive slope. In one exemplary embodiment (not illustrated), a sacrificial layer may be deposited and patterned to form a sacrificial structure with a negative slope at the post structures 610. A patterned resist layer is formed over the sacrificial structure and patterned and exposed using conventional techniques to form the confinement structure 806 with a negative slope at the openings 808. The sacrificial structure can then be removed to form the post structures 610 with a positive slope. After reading this specification, skilled artisans will be able to choose a combination of techniques to form any number of combinations of positive, negative, and vertical slopes in a confinement structure with any number of different types of openings, post structures or other features.

Figure 10:
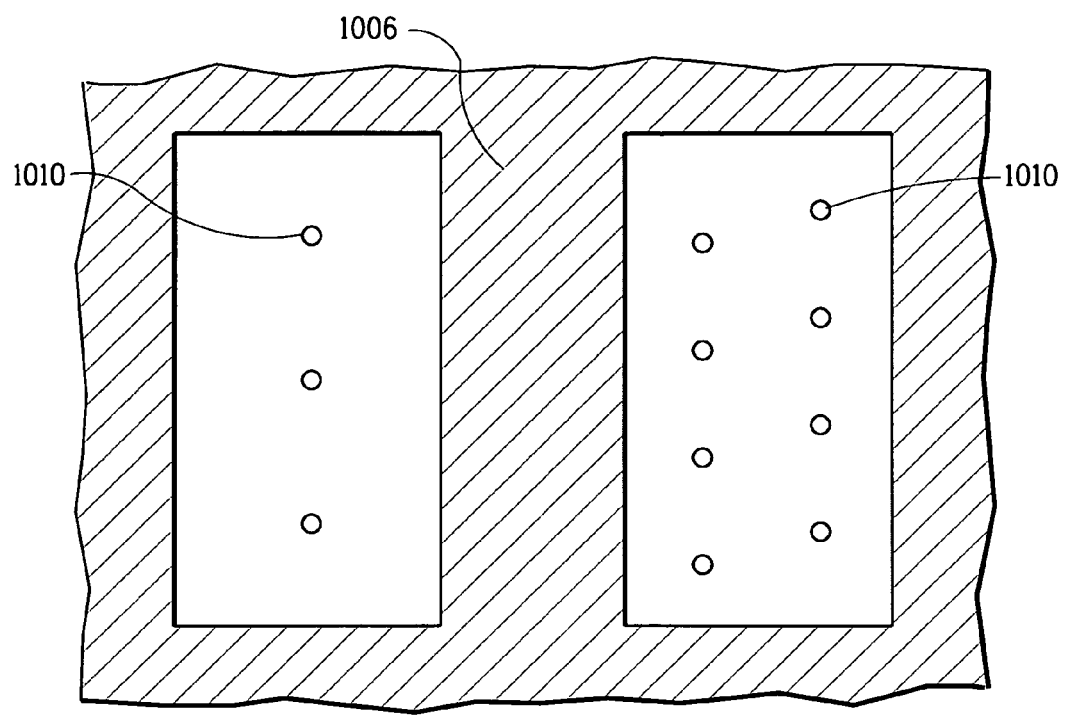
FIGS. 10 and 11 include illustrations of alternative embodiments of post structures.
Figure 11:
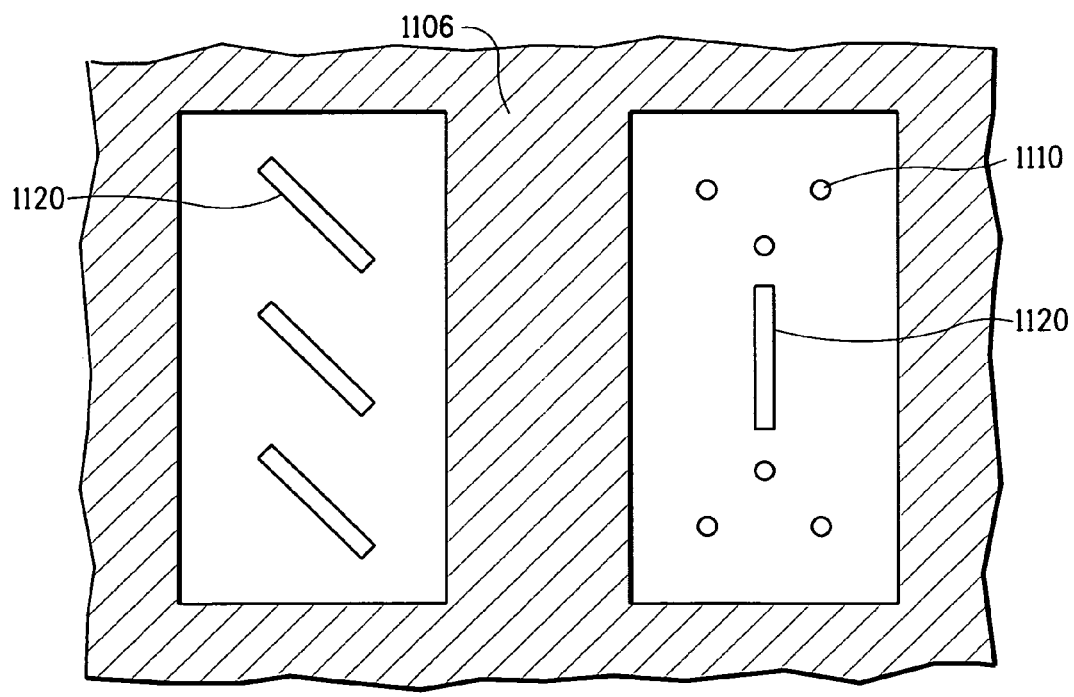

After formation, the post structures 610 may have a pattern. The pattern may, for example, be the pattern illustrated in FIG. 6. Alternative patterns are illustrated in FIGS. 10 and 11. FIG. 10 illustrates post structures that form cylindrical structures 1010 within the openings of confinement structure 1006. FIG. 11 illustrates a combination of post structures that form cylindrical structures 1110 and walls 1120 within the openings of confinement structure 1106. Skilled artisans will understand that a nearly limitless variety of shapes and patterns of post structures can be formed to suit their manufacturing processing and device performance needs.

A channel (not illustrated) may, optionally, be deposited over the substrate 402 and the confinement structure 806. The channel may or may not contact portions of the first electrodes 404 depending on the pattern of the confinement structure 806. The channel may, for example, be an electrode separator structure. In one embodiment, the channel may have a negative slope when viewed from a cross-sectional view. In other embodiments the channel may have a positive slope or a vertical slope.

In one embodiment, the channel may or may not encompass portions of the confinement structure 806 at the openings. In an alternate embodiment, the channel may be formed to entirely overlie the confinement structure 806. In general, the channel may be formed through techniques similar to those described in relation to the confinement structure 806.

Once the confinement structure 806, post structures 610, and, optionally, the channel are formed, the first electrodes 404 exposed via the openings may be cleaned, such as through UV/ozone cleaning.

In one embodiment, the confinement structure 806 may be treated to produce hydrophobic surfaces. For example, fluorine-containing plasma may be used to treat the surfaces of the confinement structures 806 and channel. The fluorine plasma may be formed using gasses such as $CF_4$, $C_2F_6$, $NF_3$, $SF_6$, or combinations thereof. The plasma process may include direct exposure plasma or use a downstream plasma. In addition, the plasma may include $O_2$. In one exemplary embodiment, a fluorine-containing plasma may include 0-20% $O_2$, such as about 8% $O_2$.

In one particular embodiment, the plasma is produced using a March PX500 model plasma generator by March Plasma Systems of Concord, Calif. The equipment is configured in flow through mode with a perforated, grounded plate and a floating substrate plate. In this embodiment, a 6-inch floating substrate plate is treated with a plasma formed from a $CF_4/O_2$ gas composition. The gas composition may include 80-100% $CF_4$, such as approximately 92% $CF_4$, and 0-20% $O_2$, such as approximately 8% $O_2$ by volume. The substrate may be exposed for 2-5 minutes, such as approximately 3 minutes, at a pressure of 300-600 mTorr, such as a 400 mTorr, using a 200-500 W plasma, such as a 400 W plasma. In one embodiment, where the confinement structure 806 is treated to be hydrophobic, but the post structures 610 is not, a sacrificial layer may be used to protect the post structures 610 during the plasma treatment, and subsequently removed. In other embodiments, materials selection or processing sequences may be altered to achieve a hydrophobic confinement structure 806 and hydrophilic post structures 610.

Figure 12:
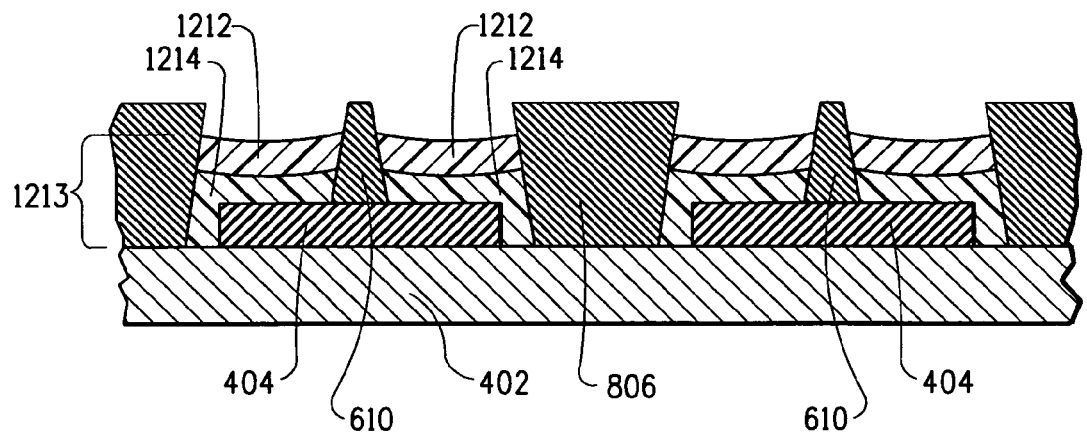
FIG. 12 includes an illustration of cross-sectional view of a portion of a substrate after formation of an organic layer over the substrate and first electrode.

FIG. 12 illustrates an exemplary sequence in the process in which an organic layer 1213 is deposited. The organic layer 1213 may include one or more organic layers. In one embodiment as illustrated in FIG. 12, the organic layer 1213 includes a charge transport layer 1214 and an organic active layer 1212. When present, the charge transport layer 1214 is formed over the first electrodes 404 and before the organic active layer 1212 is formed. The charge transport layer 1214 can serve multiple purposes. In one embodiment, the charge transport layer 1214 is a hole-transport layer. Although not shown, an additional charge transport layer may be formed over the organic active layer 1212. Therefore, the organic layer 1213 may include the organic active layer 1212 and one, both or none of the charge transport layers. Each of the charge transport layer 1214, organic active layer 1212, and additional charge transport layer may include one or more layers. In another embodiment, a single layer having a graded or continuously changing composition may be used instead of separate charge transport and organic active layers.

The charge transport layer 1214 and the organic active layer 1212 are formed sequentially over the first electrodes 404. Each of the charge transport layer 1214 and the organic active layer 1212 can be formed by, for example, but not limited to, continuous deposition techniques such as spin coating, gravure coating, curtain coating, dip coating, slot-die coating, spray coating, and continuous nozzle coating; discontinuous deposition techniques such as ink jet printing, gravure printing, and screen printing. For example, liquid compositions including the organic materials may be dispensed through nozzles, such as micronozzles. One or both of the charge transport layer 1214 and the organic active layer 1212 may be cured after application.

In this embodiment, the charge transport layer 1214 is a hole-transport layer. The hole-transport layer can be used to potentially increase the lifetime and improve the reliability of the device compared to a device where the first electrodes 404 would directly contact the organic active layer 1212. In one specific embodiment, the hole-transport layer can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 100-250 nm.

The hole-transport layer typically is conductive to allow electrons to be removed from the subsequently formed active region and transferred to the first electrodes 404. Although the first electrodes 404 and the optional hole-transport layer are conductive, typically the conductivity of the first electrodes 404 is significantly greater than the hole-transport layer.

The composition of the organic active layer 1212 typically depends upon the application of the organic electronic device. When the organic active layer 1212 is used in a radiation-emitting organic electronic device, the material(s) of the organic active layer 1212 will emit radiation when sufficient bias voltage is applied to the electrode layers. The radiation-emitting active layer may contain nearly any organic electroluminescent or other organic radiation-emitting materials.

Although not shown, an optional electron-transport layer may be formed over the organic active layer 1212. The electron-transport layer is another example of a charge transport layer. The electron-transport layer typically is conductive to allow electrons to be injected from a subsequently formed cathode and transferred to the organic active layer 1212. Although the subsequently formed cathode and the optional electron-transport layer are conductive, typically the conductivity of the cathode is significantly greater than the electron-transport layer. The electron-transport layer typically has a thickness in a range of approximately 30-500 nm.

Any one or more of the charge transport layer 1214, organic active layer 1212, and additional charge transport layer may be applied as a liquid composition that includes one or more liquid media. The hydrophobic and hydrophilic surfaces are specific with respect to the liquid media within the liquid composition. In one embodiment, the liquid composition may include a co-solvent including, for example, alcohols, glycols, and glycol ethers. A solvent for the organic active layer liquid media may be select such that it does not dissolve the charge transport layer. Alternatively, the solvent may be selected such that the charge transport layer is soluble or partially soluble in that solvent.

In a particular embodiment, the negative slope of the confinement structure 806 causes a capillary effect, drawing a liquid composition of the organic material around the perimeter of the openings 808. Once cured, the organic active layer 1212 covers underlying layers within the openings 808, such as the first electrodes 404 and charge transport layer 1214, preventing electrical shorting between conductive members, such as electrodes (e.g. anodes and cathodes).

Figure 13:
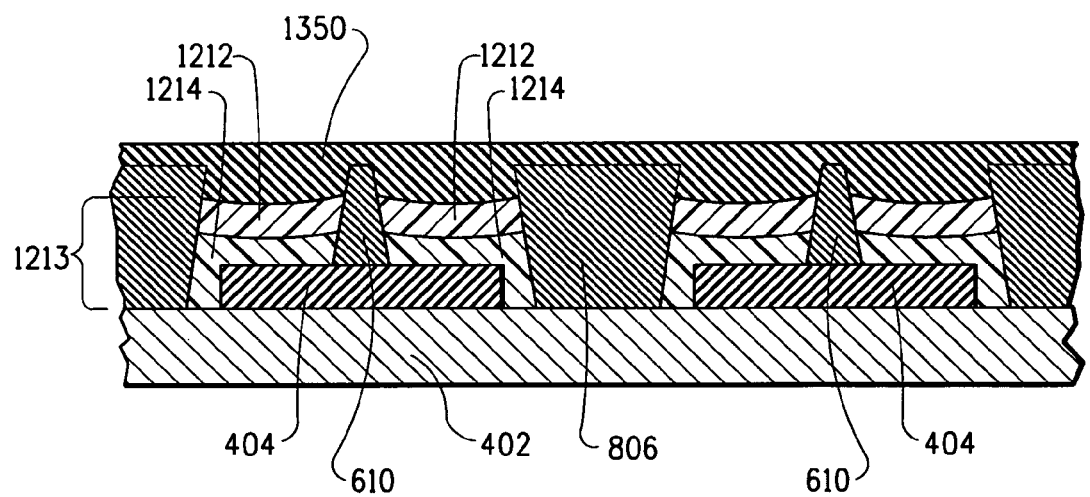
FIG. 13 includes an illustration of cross-sectional view of a portion of a substrate after formation of a second electrode over the organic layer.

A second electrode 1350, as illustrated in FIG. 13, is formed over the organic layers 1213, which in this embodiment includes the charge transport layer 1214 and the organic active layer 1212. In one embodiment, a layer is deposited using a stencil mask to form second electrodes 1350 over organic layers 1213 and over portions of the confinement structure 806 and post structures 610.

In one embodiment, the second electrodes 1350 act as cathodes. A layer of the second electrodes 1350 closest to the organic layer 1213 can be selected from Group 1 metals (e.g., Li, Cs), the Group 2 (alkaline earth) metals, the rare earth metals including the lanthanides and the actinides. The second electrode layers 1350 have a thickness in a range of approximately 50-600 nm. In one specific, non-limiting embodiment, a Ba layer of less than approximately 10 nm followed by an Al layer of approximately 500 nm may be deposited. The Al layer may be replaced by or used in conjunction with any of the metals and metal alloys.

The organic electronic components formed from an anode, such as first electrode 404, the organic layers 1213, and second electrode 1350 are addressable via peripheral circuitry. For example, applying a potential across one selected row of second electrodes 1350 and one selected column of first electrodes 404 activates one organic electronic component.

An encapsulating layer (not illustrated) can be formed over the array and the peripheral and remote circuitry to form a substantially complete electrical device, such as an electronic display, a radiation detector, and a photovoltaic cell. The encapsulating layer may be attached at the rail such that no organic layers lie between it and the substrate. Radiation may be transmitted through the encapsulating layer. If so, the encapsulating layer should be transparent to the radiation.

5. ALTERNATIVE EMBODIMENTS

The electronic device formed through the process illustrated in FIGS. 4-13 is a passive matrix device. In an alternate embodiment, the electronic device may be an active matrix device.

In the various embodiments illustrated above, the electrodes may be cathodes or anodes. For example, the first electrode 404 may be an anode or a cathode. Similarly, second electrode 1350 may be an anode or a cathode. In one particular embodiment first electrode 404 is a transparent anode overlying a transparent substrate 402. For electronic display devices, radiation emitted from organic electronic components may emit through the transparent anode and the substrate. Alternately, the first electrode 404 may be a transparent cathode.

In another embodiment, the first electrode 404 and the substrate 402 may be opaque or reflective. In this embodiment, second electrode 1350 may be formed of a transparent material and, for radiation emitting devices, radiation may be emitted from organic electronic component through second electrode 1350.

In a further embodiment, the process for forming the electronic device may be used in fabricating radiation responsive devices, such as sensor arrays, photodetectors, photoconductive cells, photoresistors, photoswitches, phototransistors, phototubes, IR detectors, biosensors, photovoltaics or solar cells. Radiation responsive devices may include a transparent substrate and substrate side electrode. Alternatively, the radiation responsive device may include a transparent overlying electrode.

In still a further embodiment, the process for forming the electronic device may be used for inorganic devices. In one embodiment, a liquid composition for forming an inorganic layer may be used and allow better coverage of the liquid composition adjacent to the same or other structures having a negative slope.

6. ADVANTAGES

After reading this specification, skilled artisans will appreciate that the thickness uniformity of organic layers can be more accurately controlled by incorporating post structures prior to applying the liquid composition. This can improve the effective aperture ratio of pixels in an electronic device. The size and shape of the post structures can be designed to match the wetting properties of liquid compositions used to deposit organic layers.

Use of this process can also reduce the need for banks or other physical confinement structures for the liquid composition during the deposition process. Using hydrophilic post structures can confine liquid compositions to a desired region of a substrate, reducing the need for additional confinement structures. Fluorination or other activities or materials to reduce surface energy may also be eliminated. Still further, a receiving layer for the liquid composition is also not required. Elimination of banks or other containment structures, fluorination or other activities or materials, a receiving layer, or any combination thereof reduces the number of manufacturing operations. Still, any of the banks or other containment structures, fluorination or other activities or materials, a receiving layer, or any combination thereof can be used if desired.

In some embodiments, the improved uniformity of the organic layer resulting from the use of the post structures can help improve the radiation emission from or collection within the electronic device. Such an improvement can increase the amount of radiation reaching the user surface of the electronic device or the amount of radiation received by one or more electronic components within the electronic device without increasing the changing the electronic operating parameters of the electronic device (e.g., voltage, current, etc.). In some embodiments, the luminance uniformity, color variation, and uniformity of degradation of electrical properties in a display device can also be improved.

Note that not all of the activities described above in the general description or the examples are required, that a portion of a specific activity may not be required, and one or more that further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more, problems, or any combination thereof has been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. An electronic device comprising:
a substrate;
a first organic electronic component comprising an organic layer having a center portion and an edge portion overlying the substrate, wherein, from a plan view, the first organic electronic component defines a perimeter of a first pixel area;
at least one post structure, wherein the at least one post structure lies within the perimeter of the first pixel area; and
a first electrode lying between the substrate and the at least one post structure;
wherein the center portion of the organic layer has a thickness in the range of 30 nm to 100 nm and the edge portion has a thickness of up to 5000 nm.

2. The electronic device of claim 1, wherein the organic layer of the first organic electronic component includes an organic active layer.

3. The electronic device of claim 1, wherein the at least one post structure comprises an island, a mesa, or a combination thereof.

4. The electronic device of claim 1, wherein from a cross-sectional view, the at least one post structure has a positive slope.

5. The electronic device of claim 1, further comprising a second electrode overlying at least portions of the at least one post structure.

6. The electronic device of claim 1, wherein a surface of the at least one post structure is hydrophilic.

7. An electronic device comprising:
a substrate;
a first organic electronic component comprising an organic layer having a center portion and an edge portion overlying the substrate;
a confinement structure overlying the substrate and having a first opening, wherein from a plan view, the first opening has a perimeter that substantially corresponds to a perimeter of the first organic electronic component;
at least one post structure, wherein from a plan view, the at least one post structure lies within the perimeter of the first opening; and
a first electrode lying between the substrate and the at least one post structure, between the substrate and the confinement structure, or a combination thereof;
wherein the center portion of the organic layer has a thickness in the range of 30 nm to 100 nm and the edge portion has a thickness of up to 5000 nm.

8. The electronic device of claim 7, wherein the organic layer of the first organic electronic component comprises an organic active layer.

9. The electronic device of claim 7, wherein a surface of the confinement structure is hydrophobic.

10. The electronic device of claim 7, wherein the at least one post structure comprises an island, a mesa, or a combination thereof.

11. The electronic device of claim 7, wherein from a cross-sectional view, the at least one post structure has a positive slope.

12. The electronic device of claim 7, further comprising a second electrode overlying at least portions of the confinement structure and the at least one post structure.

13. The electronic device of claim 7, wherein a surface of the at least one post structure is hydrophilic.

14. An electronic device comprising:
a substrate;
an array of organic electronic components each comprising an organic layer having a center portion and an edge portion overlying the substrate, wherein the array comprises rows and columns of organic electronic components;
a confinement structure overlying the substrate and having an array of openings, wherein from a plan view, the array of openings substantially corresponds to the array of organic electronic components; and
post structures, wherein from a plan view, the post structures lie within the array of openings and do not contact the confinement; and
a first electrode lying between the substrate and the post structures;
wherein the center portion of the organic layer has a thickness in the range of 30 nm to 100 nm and the edge portion has a thickness of up to 5000 nm.

15. The electronic device of claim 14, wherein the organic layer of each array of organic electronic components comprises an organic active layer.

16. The electronic device of claim 14, wherein a surface of the confinement structure is hydrophobic.

17. The electronic device of claim 14, wherein from a cross-sectional view, the post structures have a positive slope.

18. The electronic device of claim 14, wherein a surface of the post structures is hydrophilic.

* * * * *